(12) United States Patent
Tavakoli et al.

(10) Patent No.: US 12,191,120 B2
(45) Date of Patent: Jan. 7, 2025

(54) MULTILAYER COATING FOR CORROSION RESISTANCE

(71) Applicant: Applied Materials, Inc., Santa Clara, CA (US)

(72) Inventors: Amir H. Tavakoli, San Jose, CA (US); Tony S. Kaushal, Campbell, CA (US); Peter Reimer, San Jose, CA (US); David Jorgensen, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 16 days.

(21) Appl. No.: 17/691,384

(22) Filed: Mar. 10, 2022

(65) Prior Publication Data
US 2023/0290615 A1    Sep. 14, 2023

(51) Int. Cl.
| | | |
|---|---|---|
| *H01J 37/00* | (2006.01) | |
| *C04B 35/10* | (2006.01) | |
| *C04B 35/12* | (2006.01) | |
| *C04B 35/14* | (2006.01) | |
| *C04B 35/622* | (2006.01) | |

(Continued)

(52) U.S. Cl.
CPC ........ *H01J 37/32495* (2013.01); *C04B 35/10* (2013.01); *C04B 35/12* (2013.01);
(Continued)

(58) Field of Classification Search
None
See application file for complete search history.

(56) References Cited

U.S. PATENT DOCUMENTS

| | | | |
|---|---|---|---|
| 6,416,870 B1 | | 7/2002 | Hunt et al. |
| 11,851,770 B2 * | | 12/2023 | Gold ...................... B32B 18/00 |

(Continued)

FOREIGN PATENT DOCUMENTS

| | | | |
|---|---|---|---|
| JP | 2006307311 | * | 11/2006 |
| JP | 2008247722 | * | 10/2008 |
| KR | 20210092837 A | | 7/2021 |

OTHER PUBLICATIONS

Application No. PCT/US2023/064037, International Search Report and Written Opinion, Mailed On Jul. 11, 2023, 9 pages.

*Primary Examiner* — Mandy C Louie
(74) *Attorney, Agent, or Firm* — Kilpatrick Townsend & Stockton LLP (57) ABSTRACT

Exemplary methods of coating a metal-containing component are described. The methods are developed to increase corrosion resistance and improve coating adhesion to a metal substrate. The methods include forming a bonding layer on a metal substrate, where the bonding layer includes an oxide of a metal in the metal substrate. The coating methods further include depositing a stress buffer layer on the bonding layer, where the stress buffer layer is characterized by a stress buffer layer coefficient of thermal expansion (CTE) that is less than a metal substrate CTE and a bonding layer CTE. The coating methods also include depositing an environmental barrier layer on the stress buffer layer, where a ratio of the metal substrate CTE to an environmental barrier layer CTE is greater than or about 20:1, and where the environmental barrier layer includes silicon oxide. The metal-containing components may be used in fabrication equipment for electronic devices.

14 Claims, 2 Drawing Sheets

(51) Int. Cl.
*C23C 16/40* (2006.01)
*C23C 16/455* (2006.01)
*H01J 37/32* (2006.01)
*H01L 21/67* (2006.01)

(52) U.S. Cl.
CPC ........ *C04B 35/14* (2013.01); *C04B 35/62222* (2013.01); *C23C 16/402* (2013.01); *C23C 16/403* (2013.01); *C23C 16/405* (2013.01); *C23C 16/45525* (2013.01); *C04B 2235/3217* (2013.01); *C04B 2235/3241* (2013.01); *C04B 2235/3418* (2013.01); *C04B 2235/9669* (2013.01); *H01J 2237/332* (2013.01); *H01J 2237/334* (2013.01); *H01L 21/67069* (2013.01); *H01L 21/67075* (2013.01)

(56) References Cited

U.S. PATENT DOCUMENTS

| | | | |
|---|---|---|---|
| 2005/0022627 A1* | 2/2005 | Chen | A61L 2/14 75/10.19 |
| 2010/0086805 A1 | 4/2010 | Lin et al. | |
| 2010/0132762 A1* | 6/2010 | Graham, Jr. | C23C 16/403 428/473.5 |
| 2013/0209767 A1* | 8/2013 | Kolev | C23C 14/0057 427/255.28 |
| 2015/0337431 A1* | 11/2015 | Biskeborn | A61L 31/088 204/192.3 |
| 2017/0122116 A1 | 5/2017 | Lee | |
| 2017/0152968 A1 | 6/2017 | Raj et al. | |
| 2021/0251766 A1* | 8/2021 | Quintana-Ponce | A61F 2/389 |

\* cited by examiner

MULTILAYER COATING FOR CORROSION RESISTANCE

TECHNICAL FIELD

The present technology relates to processes and systems for coating components. More specifically, the present technology relates to systems and methods for coating a substrate with a multilayer anticorrosion coating.

BACKGROUND

Semiconductor processing systems may include a number of components used to support substrates, deliver formation materials and removal materials, and define processing regions and flow paths. These components may be exposed to high and low temperatures, high and low pressures, and a variety of corrosive and erosive materials. Accordingly, many processing chambers include treated or coated materials. However, as processing systems and chambers become more complex, the components incorporated within the system may become multi-piece apparatuses that may include complex geometries and features across the components. These features may similarly be exposed to environmental conditions and materials that can cause damage to the components.

Thus, there is a need for improved systems and components that can be used to produce high quality devices and structures. These and other needs are addressed by the present technology.

SUMMARY

Embodiments of the present technology include coating methods that include forming a bonding layer on a metal substrate, where the bonding layer includes an oxide of a metal in the metal substrate. The coating methods further include depositing a stress buffer layer on the bonding layer, where the stress buffer layer is characterized by a stress buffer layer coefficient of thermal expansion (CTE) that is less than a metal substrate CTE and a bonding layer CTE. The coating methods also include depositing an environmental barrier layer on the stress buffer layer, where a ratio of the metal substrate CTE to an environmental barrier layer CTE is greater than or about 20:1, and where the environmental barrier layer includes silicon oxide.

In embodiments, the metal substrate CTE is greater than or about $10 \times 10^{-6}/°$ C. In further embodiments, the environmental barrier layer CTE is less than or about $0.5 \times 10^{-6}/°$ C. In still further embodiments, the metal substrate includes stainless steel and the oxide of the metal in the bonding layer includes chromium oxide. In additional embodiments, the bonding layer is formed on the metal substrate by thermal oxidation of the metal in the metal substrate. In yet additional embodiments, the bonding layer further includes exposing the metal substrate to an atmosphere that includes ozone. In more embodiments, the stress buffer layer includes aluminum oxide. In still more embodiments, the stress buffer layer and the environmental layer are deposited by atomic layer deposition.

Additional embodiments of the present technology include methods of forming a multilayer coating on a metal substrate. The methods include forming a bonding layer on the metal substrate, where the bonding layer is characterized by a thickness of less than or about 10 nm. The methods also include depositing a stress buffer layer on the bonding layer, where the stress buffer layer is characterized by a thickness of less than or about 50 nm. The methods still also include depositing an environmental barrier layer on the stress buffer layer, where the environmental barrier layer is characterized by a thickness of greater than or about 50 nm. The multilayer coating increases the corrosion resistance of the metal substrate to at least one halogen.

In embodiments, the metal substrate includes stainless steel, and the bonding layer includes chromium oxide. In further embodiments, the stress buffer layer includes aluminum oxide and is characterized by a CTE that is greater than an environmental barrier layer CTE and less than a metal substrate CTE. In still further embodiments, the environmental barrier layer includes silicon dioxide, and the multilayer coating increases the corrosion resistance of the metal substrate to chlorine. In additional embodiments, the environmental barrier layer includes hafnium oxide, and the multilayer coating increases the corrosion resistance of the metal substrate to a halogen-containing compound. In more embodiments, the metal substrate is incorporated into a component of a semiconductor fabrication apparatus that is exposed to the at least one halogen.

Further embodiments of the present technology include a coated metal structure that includes a metal substrate. The coated metal structure further includes a multilayer coating that include a bonding layer positioned on the metal substrate, where the bonding layer includes an oxide of a metal in the metal substrate. The multilayer coating also includes a stress buffer layer positioned on the bonding layer and an environmental barrier layer positioned on the stress buffer layer. The stress buffer layer is characterized by a CTE that is greater than an environmental barrier layer CTE and less than a metal substrate CTE.

In embodiments, the metal substrate includes stainless steel and the bonding layer includes chromium oxide. In further embodiments, the environmental barrier layer includes silicon dioxide. In still further embodiments, a ratio of the metal substrate CTE to the environmental barrier layer CTE is greater than or about 20:1. In additional embodiments, the binding layer is characterized by a thickness of less than or about 10 nm, and the environmental barrier layer is characterized by a thickness of greater than or about 50 nm.

The present technology provides numerous benefits over conventional corrosion resistant coatings for metal parts exposed to highly corrosive environments. Embodiments of the present technology form anticorrosive coatings that can withstand both a highly corrosive halogen-containing atmosphere and large changes in temperature without significant corrosion etching or stress fracturing. In embodiments, the multilayer anticorrosive coatings include a stress buffer layer that reduces the stress caused by metal substrates with high CTEs on ceramic oxides with low CTEs. This reduces the stress fracturing in the corrosion-resistant ceramic oxide layer due to temperature cycling at large temperature changes. Corrosion-resistant ceramic oxides such a silicon dioxide can resist corrosion from aggressive chlorine-containing species over many temperature cycles in, for example, a semiconductor fabrication apparatus. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing includes operations that produce intricately patterned material on a substrate. The operations include remote and in-situ formation and removal processes that utilize corrosive materials, including hot gases and ionized plasmas of halogen-containing compounds, radicals, and ions. For example, etching operations often involve contacting a substrate with a halogen-containing liquid, gas, or plasma etchant that flows into a processing region of a processing apparatus. While the halogen-containing etchants are intended to etch wafers and other device substrates, they also react with the walls of a processing chamber and other equipment components to produce equipment corrosion. When the equipment components are made of metal such as stainless steel, the halogen-containing materials can react rapidly to cause equipment wear and become a source of contaminants. Over time, the corrosion increases equipment repair and replacement costs as well as increases down time for the processing apparatus.

Deposition processes similarly may use plasma enhanced processes or rapid thermal processing to form or deposit materials on substrates, which may also be deposited on chamber components. This may require cleaning operations once a substrate has been removed from the chamber. Cleaning processes may include utilizing one or more halogen-containing precursors or plasma effluents of these precursors to remove material deposited on surfaces in the processing chamber. While the cleaning may target deposited material, many exposed chamber component surfaces may be similarly attacked. For example, once the substrate has been removed from the processing chamber, a central region of the substrate support will be exposed with no residual deposition material. The cleaning process may begin to form pitting or other removal of the substrate support, which may reduce planarity, as well as integrity for a chuck. Many of these chamber components include multiple pieces bonded together to produce channels, flow paths, or sealed regions within the component. Individual pieces or a combination apparatus component within the chamber may be characterized by any number of internal features, including channels, apertures, and a variety of other topographies.

Conventional technologies have struggled to limit both corrosion and erosion to chamber components and tend to replace components regularly due to the damage caused by one or both of these mechanisms. Although some processes may include a seasoning process prior to the semiconductor substrate processing, this may cause additional challenges. For example, seasoning processes may cover portions of the substrate support, but may not fully cover a backside or stem, and thus components of a substrate support, such as a baseplate or stem, may still be exposed to process and cleaning materials. Additionally, seasoning processes typically deposit a hundred nanometers of coating or less. This may require the seasoning to be replaced for each substrate being processed, which may increase queue times, and may also reduce the likelihood of a uniform or complete coverage. Conventional technologies have attempted to protect many of these components with coatings that may be less reactive to corrosive materials, and/or may be more capable of withstanding plasma bombardment.

One conventional technology to improve corrosion resistance is to coat the component with a silicon oxide. A metal component coated with silicon oxide has significantly increased resistance to corrosion in a chlorine-containing processing environment. Silicon dioxide is significantly less reactive with chlorine-containing compounds, ions, and radicals than the metal in the component. Unfortunately, the silicon dioxide also has a significantly lower coefficient of thermal expansion (CTE) than the metal in the component. When the component is exposed to large changes in temperature during a fabrication operation, the metal expands and contracts to a greater extent than the silicon dioxide coating. The mechanical stress caused by the different thermal expansion coefficients of the two materials can create stress fractures in the silicon dioxide coating. Among other problems, the stress fractures can open pathways for chlorine-containing gases and plasmas to reach and corrode the underlying metal in the component. In some cases, the mechanical stress caused by thermal cycling can separate the silicon dioxide coating from the component to leave a gap that traps the corrosive chlorine-containing materials against the component's metal surfaces. Another challenge that adds to the complexity of applying a silicon dioxide coating on a metal substrate is a poor adhesion of the metal oxide coating to the metal substrate. The poor adhesion coat is due, in part, to the low surface energy of the silicon dioxide coating layer that leads to coating delamination when the component is in service.

Embodiments of the present technology addresses these and other issues by coating chamber components with a multilayer corrosion-resistant coating that reduces the mechanical stress felt an outer environmental barrier layer during thermal cycling. In embodiments, the multilayer coating includes a stress buffer layer formed between the outer environmental barrier layer and a bonding layer in direct contact with a metal surface of the component. In additional embodiments, the bonding layer is a self-structured layer between the metal substrate and the stress buffer layer that includes a coating stack foundation which increases the adhesion of the metal substrate to the outermost surface of the bonding layer. In still further embodiments, the stress buffer layer is characterized by a coefficient of thermal expansion between the CTE of the environmental layer and the CTE of the metal in the component. When the component coated with the present multilayer coating undergoes a large change in temperature the buffer layer reduces the mechanical stress felt by the environmental barrier layer from the larger change in volume of the metal in the component. The reduced mechanical stress felt by the environmental barrier layer during thermal cycling creates fewer stress fractures in the barrier layer. In addition, the remaining in-plane residual stress does not detach the stress buffer layer and the environmental barrier layer from the metal substrate due to the presence of the bonding layer. This permits the environmental barrier layer to maintain an impenetrable barrier to corrosive gases and plasmas present in the process environment during a fabrication operation. Metal components coated with the present multilayer corrosion-resistant coatings can have significantly longer lifetimes with less maintenance than components coated with conventional corrosion-resistant coatings.

The remaining disclosure identifies specific materials, components, and coating methods according to embodiments of the present technology. It is readily understood that the described methods, materials, components, and systems can apply to a variety of other methods, materials, components, and systems used for semiconductor device fabrication, and the fabrication of other kinds of devices where corrosion-resistant coatings protect components in the fabrication system or apparatus. Accordingly, the present technology is not limited to the described coating methods, materials, components, and systems. The disclosure will discuss non-limiting operations of exemplary coating methods as well as general components that may be coated according to embodiments of the present technology.

Figure 1:
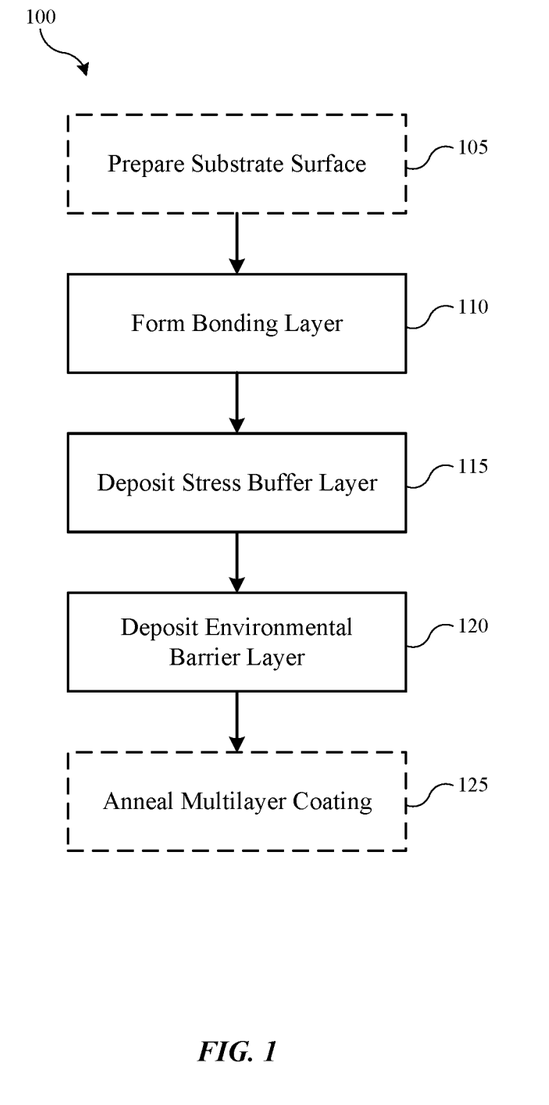
FIG. 1 shows selected operations in a method of forming a component according to some embodiments of the present technology.

FIG. 1 shows selected operations in a method 100 of coating a semiconductor component substrate according to embodiments of the present technology. Many operations of method 100 may be performed, for example, in any number of chambers or systems, including oxidation chambers and atomic-layer deposition chambers, as well as any combination of systems discussed, or which may be configured to perform operations as discussed for method 100. Method 100 may include one or more operations prior to the first described operation, including processing to produce or prepare one or more parts or pieces which may be bonded, as well as components that have been bonded already. For example, upstream processing may include casting or treating metal components, as well as preparing one or more surfaces for coating operations. The method 100 may further include optional operations that may or may not be specifically associated with embodiments of the present method. For example, some embodiments of the present coating methods that provide a broader or alternative scope of the methods may include one or more operations that do not occur, or occur at a different time, in other embodiments of the methods.

Figure 2:
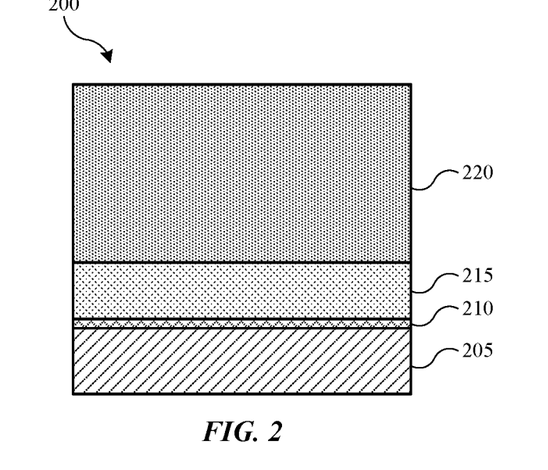
FIG. 2 shows a schematic cross-sectional view of a portion of a component coated with a multilayer corrosion resistant coating according to embodiments of the invention.

Method 100 will also be described in conjunction with the cross-sectional view of a portion of a component 200 shown in FIG. 2. Component 200 includes an embodiment of the present multilayer corrosion resistant coatings positioned on the surface of a substrate 205 that forms at least part of the component. In the embodiments shown in FIG. 2, the multilayer coating is a trilayer coating that include a bonding layer 210, a stress buffer layer 215, and an environmental barrier layer 220. It should be appreciated that the additional layers may be formed below the substrate layer 205 and above the environmental barrier layer 220. I should also be appreciated that the interface between layers may or may not have a sharp boundary. For example, a portion of the interface may include a combination of materials from two adjacent layers, such as the bonding layer 210 and the stress buffer layer 215. In embodiments of the present technology, a coated component includes one or more substrate surfaces upon which the multilayer coating is formed. The substrate surfaces include exposed surfaces of the substrate that form a bonding layer of the multilayer coating. The substrate may include one or more metals that are incorporated into the at least a portion of the component, such as the walls of the component. In embodiments, the metal substrate may be or include any number of components or component sections. In additional embodiments, the metal substrate may be incorporated into a component of a semiconductor processing system that is used to conduct semiconductor fabrication operations that use corrosive liquids, gases, and plasmas, and that experience large changes in temperature. In still additional embodiments, the metal substrate may be incorporated into semiconductor fabrication equipment components such as baseplates or edge rings, fluid delivery components such as showerheads or lid plates, structural components such as spacers or liners, as well as other single or multi-piece components of semiconductor fabrication equipment that may be coated according to the present methods. The components may be substantially planar, or may include complex geometries, which may include channels, apertures, or other features across one or more surfaces of the components. The components may be made of any number of materials, which may be or include aluminum, carbon, chromium, copper, iron, magnesium, manganese, nickel, silicon, titanium, or zinc. The components may be or include alloys, such as iron alloys, which may include any number of materials. In many embodiments, the metal substrate in the component includes stainless steel, such as 316 stainless steel. Although the discussion below may reference stainless steel, from which components according to embodiments of the present technology may be made, it is to be understood that the present technology may be employed with any iron alloy, as well as alloys of any number of other metals that may be used in semiconductor processing chambers or systems.

In embodiments, method 100 may include preparing a surface of a substrate 205 at operation 105. In further embodiments, the preparations may include one or more of removing an existing coating from the substrate surface, roughening the substrate surface, smoothing the substrate surface, exposing the substrate surface to an oxidizing environment, exposing the substrate surface to a passivating environment, and exposing the substrate surface to an etching environment, among other preparations. In some embodiments, substrate surface preparation operation 105 may be bypassed because the substrate surface is already primed to form the bonding layer. In other embodiments, method 100 includes operation 105 so that the bonding layer 210 can be formed in a targeted time at a sufficient quality of the prepared surface of substrate 205.

In additional embodiments substrate surface preparation operation 105 may include the removal of oxides, organics, oil, soil, particulate, debris, and/or other contaminants, from the surface of the substrate 205. In further embodiments, the preparations may include blasting or texturing the surface, exposing the surface to a vacuum, solvent cleaning the surface, acid cleaning the surface, wet clean the surface, plasma cleaning the surface, and sonication of the surface, among other preparations. The prepared surface of the substrate 205 may be characterized by faster formation and stronger bonding of a bonding layer on the surface compared to an unprepared substrate surface.

In further embodiments, the preparation of the substrate surface may include blasting or otherwise exposing the surface to one or more kinds of abrasive particulates such as beads, sand, and carbonates, among other kinds of particulates. In embodiments, the particulate exposure removes oxides and other contaminates from the substrate surface and may also provide texturing to the surface of the substrate 205. In more embodiments, the preparation of the substrate surface may include placing the component 200 into a chamber within a pulsed push-pull gas cycling system and exposing the substrate surface of the component to at least one cycle of a purge gas such as nitrogen, argon, helium, and mixtures thereof. In further embodiments, the component 200 may be exposed to at least one vacuum purge to remove particulates and other debris from the substrate surface. In still more embodiments, the component 200 is placed into a plasma chamber and the substrate surface is exposed to one or more kinds of plasma, such as a hydrogen-containing plasma, an oxygen- or ozone-containing plasma, and a nitrogen-containing plasma, among other kinds of plasma. In yet more embodiments, the plasma may be generated in situ, or may be remotely generated outside the chamber holding the component 200 and delivered to the chamber.

In more embodiments, the preparation of the substrate surface may include removal one or more organic compounds and oxide compounds from the surface of the substrate 205. In additional embodiments, organic and oxide compounds may be removed from the surface by a reducing plasma, such as a hydrogen plasma. In more embodiments, the reduced organic and oxide compounds may be degassed from the surface and exposed to ozone. In still more embodiments, the preparation of the substrate surface may include a wet clean to remove organic compounds from the surface. In embodiments the wet clean may include soaking the substrate surface in an alkaline degreasing solution, rinsing, exposing the surface to an acid clean (e.g., sulfuric acid, phosphoric acid, or hydrochloric acid), rinsing again, and exposing the surfaces deionized water sonication bath. In yet additional embodiments, the preparation of the substrate surface may include a wet clean to remove oxide compounds from the surface. In embodiments the wet clean may include exposing the substrate surface to a dilute acid solution (e.g., acetic acid or hydrochloric acid), rinsing, and exposing the surface to deionized water in a sonication bath. In further embodiments, the preparation of the substrate surface may include a preparation operation to remove particles from the substrate surface. In embodiments, these particle removal preparations may include exposing the substrate surface to sonication (e.g., megasonication) and/or a supercritical carbon dioxide wash, followed by exposing to cycles of purge gas (e.g., $N_2$, Ar, He, or any combination thereof) and vacuum purges to remove particles from and dry the surfaces. In yet further embodiments, the preparation of the substrate surface may include exposing the surface to heating and drying operations. In embodiments, the heating operation may include exposing the substrate surface to a temperature above room temperature. In additional embodiments the elevated temperature may be characterized as a temperature greater than or about 50° C., greater than or about 75° C., greater than or about 100° C., greater than or about 125° C., greater than or about 150° C., greater than or about 175° C., greater than or about 200° C., or more. In more embodiments, the heating operation may include exposing the substrate surface to a heat lamp or placing the component in an oven.

Method 100 may further include forming a bonding layer 210 on the surface of the substrate 205 at operation 110. In embodiments, the bonding layer 210 may be formed by having the component that includes the substrate surface in an environment that forms an oxide of at least one metal in the component. In further embodiments, the oxide forming environment may include one or more oxidizing agents in contact with the substrate surface. In additional embodiments, the oxidizing agents may include water (e.g., steam), molecular oxygen ($O_2$), atomic oxygen (O), oxygen ions, ozone ($O_3$), nitrous oxide, peroxide-containing compounds (e.g., $H_2O_2$), and hydroxide containing compounds (e.g., alcohols). among other oxidizing agents. In more embodiments, the oxidizing agent may be incorporated into an oxidizing gas mixture. In still more embodiments, the oxidizing agent or oxidizing gas mixture may be energized to form an oxidizing plasma.

In additional embodiments, the bonding layer 210 may be formed on the surface of the substrate 205 by thermal oxidation of the substrate. In yet additional embodiments, the formation of the bonding layer 210 by thermal oxidation may be followed by a thermal passivation of the bonding layer. In more embodiments, the bonding layer 210 may be formed on the surface of the substrate 205 by chemical passivation of the metal substrate using an acid solution such as nitric acid or citric acid, among other acid solutions. In still more embodiments, the bonding layer 210 may be formed on the surface of the substrate 205 by ozone passivation of the metal substrate. In yet additional embodiments, the bonding layer 210 may be formed on the surface of the substrate 205 by atomic layer deposition.

In embodiments, the at least one metal oxidized on the surface of the substrate 205 to form the metal oxide in the bonding layer 210 may include chromium, aluminum, silicon, titanium, iron, nickel, zirconium, and hafnium, among other metals. In further embodiments, the metal oxide in the bonding layer may include chromium oxide (e.g., $Cr_2O_3$) at a level greater than or about 50 wt. %, greater than or about 60 wt. %, greater than or about 70 wt. %, greater than or about 80 wt. %, greater than or about 90 wt. %, greater than or about 95 wt. % or more of the total metal oxide in the bonding layer. In further embodiments, the bonding layer may be formed to a thickness of less than or about 20 nm, less than or about 15 nm, less than or about 10 nm, less than or about 9 nm, less than or about 8 nm, less than or about 7 nm, less than or about 6 nm, less than or about 5 nm, or less.

In some embodiments, at least a portion of the bonding layer 210 may be formed by the deposition of metal oxide directly on the metal-containing surface of the substrate 205. In embodiments, the deposition process may include a vapor deposition process such as atomic layer deposition (ALD), plasma-enhanced atomic layer deposition (PE-ALD), thermal chemical vapor deposition (CVD), and plasma-enhanced chemical vapor deposition (PE-CVD), among other vapor deposition processes. In further embodiments, the deposition process may include a vapor deposition process that provides a metal-containing reactant and an oxidizing reactant to a deposition processing region. In still further embodiments, the reactants react in the deposition processing region to deposit at least a portion of the bonding layer 210 on the surface of the substrate 205. In more embodiments, the metal-containing reactant may include a chromium-containing reactant, an aluminum-containing reactant, a silicon-containing reactant, a titanium-containing reactant, an iron-containing reactant, a nickel-containing reactant, a zirconium-containing reactant, and a hafnium-containing reactant, among other metal-containing reactants. In further embodiments, the chromium-containing reactants may include one or more of chromium cyclopentadiene compounds, chromium carbonyl compounds, chromium acetylacetonate compounds, chromium diazadienyl compounds, substitutes thereof, complexes thereof, abducts thereof, salts thereof, or any combination thereof. In more embodiments, the chromium-containing reactants may include bis(cyclopentadiene) chromium (Cp$_2$Cr), bis(pentamethylcyclopentadiene) chromium ((Me$_5$Cp)$_2$Cr), bis(isoproplycyclopentadiene) chromium ((iPrCp)$_2$Cr), bis(ethylbenzene) chromium ((EtBz)$_2$Cr), chromium hexacarbonyl (Cr((CO)$_6$), chromium acetylacetonate (Cr(acac)$_3$, also known as, tris(2,4-pentanediono) chromium), chromium hexafluoroacetylacetonate (Cr(hfac)$_3$) chromium(III) tris(2,2,6,6-tetramethyl-3,5-heptanedionate) {Cr(tmhd)$_3$}, chromium(II) bis(1,4-ditertbutyldiazadienyl), isomers thereof, complexes thereof, abducts thereof, salts thereof, or any combination thereof. In embodiments, the chromium-containing reactants may include chromium diazadienyl compounds having a chemical formula of:

where each R and R' is independently selected from H, C1-C6 alkyl, aryl, acyl, alkylamido, hydrazido, silyl, aldehyde, keto, C2-C4 alkenyl, alkynyl, or substitutes thereof. In some embodiments, each R is independently a C1-C6 alkyl which is selected from methyl, ethyl, propyl, butyl, or isomers thereof, and R' is H. In yet more embodiments, R is methyl and R' is H, R is ethyl and R' is H. R is iso-propyl and R' is H, or R is tert-butyl and R' is H.

Method 100 further includes depositing a stress buffer layer 215 on the bonding layer 210 at operation 110. In embodiments, the stress buffer layer 210 is characterized by a stress buffer layer CTE that is less than the CTE of the substrate 205 on which the bonding layer 210 is formed. In additional embodiments, the stress buffer layer CTE is greater than the CTE of an environmental barrier layer 220 deposited on a surface of the stress buffer layer 215 opposite the surface in contact with the bonding layer 210. The intermediate CTE of the stress buffer layer 215 relative to the higher CTE of the substrate of the component and the lower CTE of the environmental barrier layer 220 reduces the mechanical stress on the environmental barrier layer when the coated component experiences large changes in temperature. The reduced mechanical stress on the environmental barrier layer 220 reduces the frequency and size of stress fractures in the environmental barrier layer that can create pathways for corrosive gases, plasmas, and other materials to reach the underlying coating layers and the surface of substrate 205. In embodiments, the stress buffer layer 215 may include a metal oxide composition with a CTE lower than the metal substrate CTE and higher than the CTE of the environmental barrier layer. In additional embodiments, the stress buffer layer 215 may include one or more metal oxides selected from aluminum oxide, chromium oxide, and titanium oxide, among other metal oxides. In further embodiments, the stress buffer layer 215 may be characterized by a stress buffer layer CTE of less than or about 10×10$^{-6}$/° C., less than or about 9×10$^{-6}$/° C., less than or about 8×10$^{-6}$/° C., less than or about 7×10$^{-6}$/° C., less than or about 6×10$^{-6}$/° C., less than or about 5×10$^{-6}$/° C., or less.

In embodiments, stress reduction in the environmental barrier layer 220 can also be moderated by the thickness of the stress buffer layer 215. The further apart the environmental barrier layer 220 is from the substrate surface, the more attenuated the stress on the environmental barrier layer due to the difference in CTEs between the barrier layer and the substrate 205. In additional embodiments, the stress buffer layer 215 may be characterized by a thickness of greater than or about 10 nm, greater than or about 20 nm, greater than or about 30 nm, greater than or about 40 nm, greater than or about 50 nm, greater than or about 60 nm, greater than or about 70 nm, greater than or about 80 nm, greater than or about 90 nm, greater than or about 100 nm, or more.

In additional embodiments, the stress buffer layer 215 may be deposited by a vapor deposition process such as atomic layer deposition (ALD), plasma-enhanced atomic layer deposition (PE-ALD), thermal chemical vapor deposition (CVD), and plasma-enhanced chemical vapor deposition (PE-CVD), among other vapor deposition processes. In further embodiments, the deposition process may include a vapor deposition process that provides a metal-containing reactant and an oxidizing reactant to a deposition processing region that has exposure to at least a portion of the bonding layer formed on the substrate surface. The metal-containing reactant and the oxidizing reactant deposit a metal oxide-containing stress buffer layer on the bonding layer.

In further embodiments, the stress buffer layer 215 may be deposited by an atomic layer deposition process that provides an aluminum-containing reactant and an oxidizing reactant to a deposition processing region where they form an aluminum oxide containing stress buffer layer on at least a portion of the bonding layer 210. In more embodiments, the aluminum-containing reactant can include one or more of aluminum alkyl compounds, one or more of aluminum alkoxy compounds, and one or more of aluminum acetylacetonate compounds, among other aluminum-containing reactants. In still more embodiments, the aluminum containing reactant can include trimethylaluminum, triethylaluminum, tripropylaluminum, tributylaluminum, trimethoxyaluminum, triethoxyaluminum, tripropoxyaluminum, tributoxyaluminum, aluminum acetylacetonate (Al(acac)$_3$, also known as, tris(2,4-pentanediono) aluminum), aluminum hexafluoroacetylacetonate (Al(hfac)$_3$), and trisdipivaloylmethanatoaluminum (DPM$_3$Al; (C$_{11}$H$_{19}$O$_2$)$_3$Al), among other aluminum-containing, reactants. In additional embodiments, the oxidizing reactant can include one or more of water (e.g., steam), oxygen (O$_2$), atomic oxygen (O), ozone (O$_3$), nitrous oxide, one or more peroxides, one or more alcohols, plasmas thereof, or any combination thereof. In further embodiments, one or both of the aluminum-containing reactant and the oxidizing reactant may include one or more carrier gases such as nitrogen (N$_2$), argon, helium, neon, and hydrogen (H$_2$), among other carrier gases.

In more embodiments, the atomic layer deposition of the stress buffer layer 215 may include one or more cycles of exposing the component having the bonding layer to the metal-containing reactant, conducting a purge-pump operation of the deposition processing region to remove residual metal-containing reactant, exposing the component to the oxidizing reactant, and conducting another purge-pump operation to remove residual oxidizing reactant from the deposition processing region. In still more embodiments, the ALD operation may include greater than or about 1 cycle, greater than or about 2 cycles, greater than or about 3 cycles, greater than or about 4 cycles, greater than or about 5 cycles, greater than or about 8 cycles, greater than or about 10 cycles, greater than or about 15 cycles, greater than or about 20 cycles, greater than or about 30 cycles, greater than or about 50 cycles, greater than or about 80 cycles, greater than or about 100 cycles, or more. In still more embodiments, each cycle may deposit a portion of the stress buffer layer 215 characterized by a thickness of less than or about 10 nm, less than or about 7.5 nm, less than or about 5 nm, less than or about 2.5 nm, less than or about 1 nm, less than or about 0.5 nm, less than or about 0.1 nm, or less.

Method 100 also includes depositing an environmental barrier layer 220 at operation 120. In embodiments, the environmental barrier layer 220 may be characterized by a higher corrosion resistance to one or more corrosive substances relative to the substrate 205 of the component 200. In further embodiments the one or more corrosive substances may include one or more halogens such as fluorine, chlorine, and bromine. In further embodiments, the halogen may be included in a halogen-containing compound, radical, or ion, incorporated into a halogen-containing liquid, solution, precursor, gas, or plasma, among other halogen-containing mediums. In still further embodiments, a halogen etch rate ratio of the substrate surface to the environmental barrier layer 220 may be characterized as greater than or about 10:1, greater than or about 50:1, greater than or about 100:1, greater than or about 200:1, greater than or about 300:1, greater than or about 400:1, greater than or about 500:1, greater than or about 600:1, greater than or about 700:1, greater than or about 800:1, greater than or about 900:1, greater than or about 1000:1, or more.

In embodiments, the corrosion resistance of the coated component 200 is increased by increasing a thickness of the environmental barrier layer 220. The more material a corrosive substance has to penetrate or remove to reach the surface of substrate 205, the longer the coated component can resist the corrosive effects of the corrosive substance. In further embodiments, the environmental barrier layer 220 may be characterized by a thickness of greater than or about 50 nm, greater than or about 75 nm, greater than or about 100 nm, greater than or about 125 nm, greater than or about 150 nm, greater than or about 175 nm, greater than or about 200 nm, greater than or about 225 nm, greater than or about 250 nm, greater than or about 275 nm, greater than or about 300 nm, greater than or about 350 nm, greater than or about 400 nm, greater than or about 450 nm, greater than or about 500 nm, or more. In embodiments where the environmental barrier layer 220 is the outermost layer of the multilayer coating on the component 200, the multilayer coating may be characterized by a thickness of greater than or about 500 nm, greater than or about 600 nm, greater than or about 700 nm, greater than or about 800 nm, greater than or about 900 nm, greater than or about 1000 nm, or more.

In additional embodiments, the environmental barrier layer 220 may include a silicon oxide such as silicon dioxide. In further embodiments, the silicon oxide (e.g., $SiO_2$) in the environmental barrier layer may be greater than or about 50 wt. %, greater than or about 60 wt. %, greater than or about 70 wt. %, greater than or about 80 wt. %, greater than or about 90 wt. %, greater than or about 95 wt. % or more of the total weight of the environmental barrier layer. In yet further embodiments, the environmental barrier layer 220 may be deposited by a vapor deposition process such as atomic layer deposition (ALD), plasma-enhanced atomic layer deposition (PE-ALD), thermal chemical vapor deposition (CVD), and plasma-enhanced chemical vapor deposition (PE-CVD), among other vapor deposition processes. In further embodiments, the deposition process may include a vapor deposition process that provides a semiconductor- or metal-containing reactant and an oxidizing reactant to a deposition processing region that has exposure to at least a portion of the stress buffer layer 215 formed on the component 200. The semiconductor- or metal-containing reactant and the oxidizing reactant deposit an oxide-containing environmental barrier layer 220 on the stress buffer layer 215. In additional embodiments, the semiconductor- or metal-containing reactant may include a silicon-containing reactant such as silane, a silicon chloride, a silicon cyanate, an oxysilane, or an aminosilane, among other silicon-containing reactants. In still additional embodiments, the silane may include one or more of silane, di silane, trisilane, tetrasilane, pentasilane, and hexasilane, among other silanes. In yet further embodiments, the silicon chlorides may include one or more of monochlorosilane, dichlorosilane, trichlorosilane, tetrachlorosilane, and hexachlorosilane, among other silicon chlorides. In more embodiments, the silicon cyanates may include tetraisocyanatosilane, among other silicon cyanates. In yet more embodiments, the oxysilanes may include tetraethoxysilane, among other oxysilanes. In additional embodiments, the aminosilanes may include tris(dimethyloamino)silane, among other aminosilanes.

In more embodiments, the silicon-oxide-containing environmental barrier layer 220 may increase the coated component's corrosion resistance to chlorine-containing corrosive substances. In embodiments these chlorine-containing corrosive substances may include one or more of hydrogen chloride or hydrochloric acid (HCl), molecular chlorine ($Cl_2$), chlorine radicals (Cl), and oxygen-chlorine compounds, nitrogen-chloride compounds, and carbon-chlorine compounds, among other chlorine-containing substances. In additional embodiments, the silicon-oxide-containing environmental barrier layer 220 may reduce the coated component's corrosion rate from chlorine-containing corrosive substances compared to the corrosion rate for the substrate 205 of an uncoated component. In still additional embodiments, the silicon-oxide-containing environmental barrier layer 220 may reduce the coated component's corrosion rate to less than or about 90%, less than or about 80%, less than or about 70%, less than or about 60%, less than or about 50%, less than or about 40%, less than or about 30%, less than or about 20%, less than or about 10%, less than or about 5%, less than or about 1%, or less of the corrosion rate of the uncoated component.

In still more embodiments, the environmental barrier layer 220 may include a hafnium oxide. In further embodiments, the hafnium oxide (e.g., $HfO_2$) in the environmental barrier layer may be greater than or about 50 wt. %, greater than or about 60 wt. %, greater than or about 70 wt. %, greater than or about 80 wt. %, greater than or about 90 wt. %, greater than or about 95 wt. % or more of the total weight of the environmental barrier layer. In yet further embodiments, the hafnium-oxide-containing environmental barrier layer 220 may be deposited by a vapor deposition process such as atomic layer deposition (ALD), plasma-enhanced atomic layer deposition (PE-ALD), thermal chemical vapor deposition (CVD), and plasma-enhanced chemical vapor deposition (PE-CVD), among other vapor deposition processes. In further embodiments, the deposition process may include a vapor deposition process that provides a hafnium-containing reactant and an oxidizing reactant to a deposition processing region that has exposure to at least a portion of the stress buffer layer 215 formed on the component 200. In additional embodiments, the hafnium-containing reactant hafnium cyclopentadiene compounds, hafnium amino compounds, hafnium alkyl compounds, and hafnium alkoxy compounds, among other hafnium-containing, reactants. In more embodiments, the hafnium-containing reactants may include bis(methylcyclopentadiene) dimethylhafnium (($MeCp)_2HtMe_2$), bis(methylcyclopentadiene) methylmethoxyhafnium ($MeCp)_2Hf(OMe)(Me)$), bis(cyclopentadiene) dimethylhafnium (($Cp)_2HfMe_2$), tetra(tert-butoxy) hafnium, hafniumum isopropoxide (($iPrO)_4Hf$), tetrakis(dimethylamino) hafnium (TDMAH), tetrakis(diethylamino) hafnium (TDEAH), and tetrakis(ethylmethylamino) hafnium (TEMAH), among other hafnium-containing reactants.

In more embodiments, the hafnium-oxide-containing environmental barrier layer 220 may increase the coated component's corrosion resistance to halogen-containing corrosive substances. These halogen-containing corrosive substances include chlorine-containing-corrosive substances, fluorine-containing corrosive substances, and mixed chlorine-and-fluorine-containing corrosive substances, among other halogen-containing corrosive substances. In additional embodiments, the chlorine-containing corrosive substances may include one or more of hydrogen chloride or hydrochloric acid (HCl), molecular chloride ($Cl_2$), chlorine radicals (Cl), oxygen-and-chlorine containing compounds, nitrogen-and-chloride containing compounds, and carbon-and-chlorine-containing compounds, among other chlorine-containing corrosive substances. In further embodiments, the fluorine-containing corrosive substances may include one or more of hydrogen fluoride or hydrofluoric acid (HF), molecular fluorine ($F_2$), fluorine radicals (F), and oxygen-fluorine compounds, nitrogen-fluorine compounds (e.g., $NF_3$), and carbon-fluorine compounds (e.g., $CF_4$), among other fluorine-containing substances. In still further embodiments, the mixed chlorine-and-fluorine-containing corrosive substances may include carbon-chlorine-and-fluorine-containing compounds such as $CCl_2F_2$, among others. In additional embodiments, the hafnium-oxide-containing environmental barrier layer 220 may reduce the coated component's corrosion rate from halogen-containing corrosive substances compared to the corrosion rate for the substrate 205 on an uncoated component. In still additional embodiments, the hafnium-oxide-containing environmental barrier layer 220 may reduce the coated component's corrosion rate to less than or about 90%, less than or about 80%, less than or about 70%, less than or about 60%, less than or about 50%, less than or about 40%, less than or about 30%, less than or about 20%, less than or about 10%, less than or about 5%, less than or about 1%, or less of the corrosion rate of the uncoated component.

In some embodiments, the environmental barrier layer 220 may include two or more layers made of different oxide materials (not shown). For example, the environmental barrier layer 220 may include a first barrier layer made of silicon dioxide and a second barrier layer made of hafnium oxide. In additional embodiments, the environmental barrier layer 220 may be a multilayer barrier that includes alternating layers of silicon oxide and hafnium oxide. In embodiments, the multilayer coating including the environmental barrier layer may be characterized by at least three layers, at least four layers, at least five layers, at least six layers, or more. In additional embodiments, the environmental barrier layer 220 may be a single layer made of a mixture of two or more oxide materials, such as a mixture of silicon dioxide and hafnium oxide. In yet additional embodiments, the environmental barrier layer 220 may further include oxides of one or more additional metals such as aluminum, chromium, magnesium, nickel, titanium, and zirconium, among other metals.

Method 100 may still further optionally include annealing the multilayer coating formed on the surface of the substrate 205 at operation 125. In embodiments, the annealing operation may include one or more of a thermal anneal, a plasma anneal, an ultraviolet anneal, or a laser anneal, among other type of anneals. In additional embodiments, the anneal may increase the density of one or more layers of the multilayer coating. In further embodiments, the anneal may increase the crystallinity and slightly change the composition of one or more layers of the multilayer coating.

In embodiments, the anneal may including heating the component coated with the as-deposited multilayer coating to a temperature of greater than or about 100° C., greater than or about 200° C., greater than or about 300° C., greater than or about 400° C., greater than or about 500° C., or more. In more embodiments, the anneal may include exposing the coated component to an oxidizing, neutral, or reducing environment. In embodiments, the oxidizing environment may include oxygen ($O_2$), the neutral environment may include nitrogen ($N_2$), and the reducing environment may include hydrogen ($H_2$). In further embodiments, the anneal environment may be a low pressure environment characterized by a pressure of less than or about 700 Torr, less than or about 600 Torr, less than or about 500 Torr, less than or about 400 Torr, less than or about 300 Torr, less than or about 200 Torr, less than or about 100 Torr, less than or about 50 Torr, less than or about 25 Torr, less than or about 10 Torr, less than or about 1 Torr, less than or about 0.1 Torr, less than or about 0.01 Torr, less than or about 0.001 Torr, or less. In more embodiments, the anneal environment may be an ambient or high-pressure environment characterized by a pressure of greater than or about 760 Torr, greater than or about 1000 Torr, greater than or about 1500 Torr, greater than or about 2000 Torr, greater than or about 2500 Torr, greater than or about 3000 Torr, greater than or about 3500 Torr, or more. In still further embodiments, the duration of the anneal may be greater than or about 1 minute, greater than or about 5 minutes, greater than or about 10 minutes, greater than or about 30 minutes, greater than or about 60 minutes, greater than or about 90 minutes, greater than or about 180 minutes, or more. In embodiments where the anneal is of short duration, such as a spike anneal, the duration of the anneal may be characterized as less than or about 15 second, less than or about 10 seconds, less than or about 5 seconds, less than or about 1 second, less than or about 0.1 seconds, less than or about 0.01 seconds, less than or about 0.001 seconds, or less.

In embodiments, the layers of the multilayer corrosion-resistant coating formed and optionally annealed on substrate 205 may be characterized by additional properties that increase the coatings corrosion resistance. In additional embodiments, the multilayer coating may be characterize by an increased hardness compared to coatings formed by conventional methods. In still further embodiments the present multilayer coatings may be characterized by a Vickers hardness of greater than or about 1000, greater than or about 1200, greater than or about 1400, greater than or about 1600, greater than or about 1800, greater than or about 2000, or more. Additionally, the multilayer coatings may be characterized by increased dielectric breakdown voltage characteristics, which may facilitate use of the coatings on components that may be operated as an electrode in a semiconductor processing system. For example, coatings according to embodiments of the present technology may be characterized by dielectric breakdown of greater than or about 20 V/μm, and may be characterized by dielectric breakdown of greater than or about 25 V/μm, greater than or about 30 V/μm, greater than or about 35 V/μm, greater than or about 40 V/μm, or greater. In some embodiments, this characteristic may be further increased by performing one or more post-processing operations.

Figure 3:
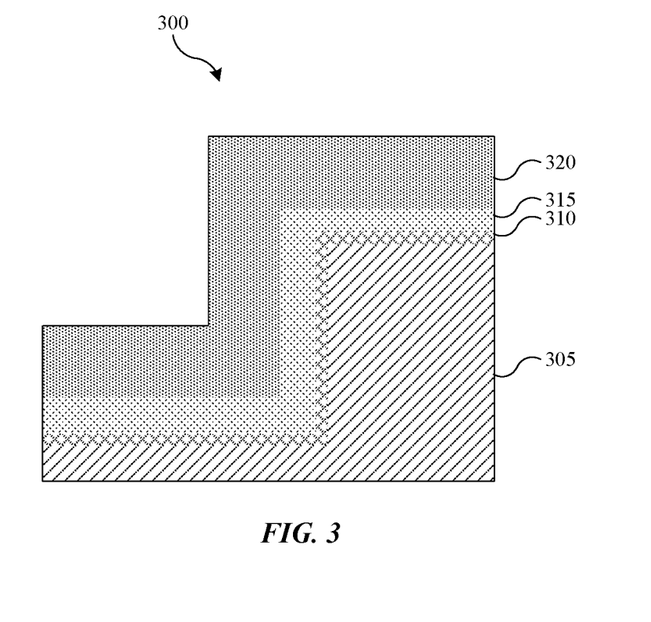
FIG. 3 shows a schematic cross-sectional view of a portion of a component coated with a multilayer corrosion resistant coating according to additional embodiments of the invention.

FIG. 3 show a cross-sectional view of a portion of a component 300 coated with a multilayer corrosion resistant coating according to additional embodiments of the invention. The substrate 305 of component 300 include a step to illustrate the conformality of the bonding layer 310, stress buffer layer 315, and environmental barrier layer 320 to steps, trenches, apertures, channels, fluid paths, tubes, and openings among other shapes of the substrate of the component. In embodiments, the present technology includes the formation of conformal coatings, which may extend across any variety of features and aspects of components. In embodiments, the conformality of the coating may be characterized by a low variation in the thickness of the multilayer coating on orthogonal surfaces of the step in the substrate 305. In embodiments, the variation in the thickness of the multilayer coating between orthogonal surfaces may be characterized as less than or about 10%, less than or about 7.5%, less than or about 5%, less than or about 2.5%, less than or about 1%, or less.

In additional embodiments, the component 300 may include one or more apertures (not shown) characterized by an aspect ratio (i.e., a height to width ratio) of greater than or about 1:1, greater than or about 2:1, greater than or about 3:1, greater than or about 4:1, greater than or about 5:1, greater than or about 6:1, greater than or about 7:1, greater than or about 8:1, greater than or about 10:1, or more. In still additional embodiments, the multilayer coating may be characterized by a high degree of uniformity on the interior walls of an aperture compared with other portions of the coating. In embodiments, the uniformity of the multilayer coating between the interior walls of the aperture and other portions of the coating may be characterized as having a thickness within 90% of each other and may be characterized by a thickness within 92% of each other, within 94% of each other, within 96% of each other, within 98% of each other, within 99% of each other, or essentially equivalent to each other within a margin of error for any measurement device or technology being used.

The present technology includes metal-containing components coated with a multilayer coating that provides the component with increased corrosion resistance. In embodiments, the multilayer coating includes a stress buffer layer that reduces mechanical stresses felt by an outer environmental barrier layer from the difference in the coefficient of thermal expansion between the ceramic materials in the barrier layer and the metal substrate of the component. In additional embodiments, the multilayer coating also includes a bonding layer that increases the adhesion of the stress buffer layer and environmental barrier layer to the metal substrate of the component. The combination of the bonding layer, the stress buffer layer, and the environmental barrier layer makes the multilayer coating less prone to fractures and delamination experienced by conventional, single layer ceramic coatings formed directly on the substrate surfaces of metal-containing components. In embodiments, device fabrication components coated with the present multilayer coatings have extended operational lifetimes compared to uncoated components and components coated with single layer anti-corrosion coatings.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where neither of the limits, either limit, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A coating method comprising:
forming a bonding layer on a metal substrate, wherein the bonding layer comprises an oxide of a metal in the metal substrate;
depositing a stress buffer layer on the bonding layer, wherein the stress buffer layer comprises a coefficient of thermal expansion (CTE) that is less than a coefficient of thermal expansion of the metal substrate and a coefficient of thermal expansion of the bonding layer;
depositing an environmental barrier layer on the stress buffer layer, wherein a ratio of the coefficient of thermal expansion of the metal substrate to a coefficient of thermal expansion of the environmental barrier layer is greater than or about 20:1, wherein the coefficient of thermal expansion of the environmental barrier layer is less than the coefficient of thermal expansion of the stress buffer layer, and wherein the environmental barrier layer comprises silicon oxide.

2. The coating method of claim 1, wherein the coefficient of thermal expansion of the metal substrate is greater than or about $10 \times 10^{-6}/°C$.

3. The coating method of claim 1, wherein the coefficient of thermal expansion of the environmental barrier layer CTE is less than or about $0.5 \times 10^{-6}/°$ C.

4. The coating method of claim 1, wherein the metal substrate comprises stainless steel and the oxide of the metal in the bonding layer comprises chromium oxide.

5. The coating method of claim 1, wherein the bonding layer is formed on the metal substrate by thermal oxidation of the metal in the metal substrate.

6. The coating method of claim 5, wherein the forming of the bonding layer further comprises exposing the metal substrate to an atmosphere comprising ozone.

7. The coating method of claim 1, wherein the stress buffer layer comprises aluminum oxide.

8. The coating method of claim 1, wherein the stress buffer layer and the environmental barrier layer are deposited by atomic layer deposition.

9. A method of forming a multilayer coating on a metal substrate, the method comprising:
   forming a bonding layer on the metal substrate, wherein the bonding layer is characterized by a thickness of less than or about 10 nm;
   depositing a stress buffer layer on the bonding layer, wherein the stress buffer layer is characterized by a thickness of less than or about 50 nm;
   depositing an environmental barrier layer on the stress buffer layer, wherein the environmental barrier layer is characterized by a thickness of greater than or about 50 nm,
   wherein the multilayer coating increases corrosion resistance of the metal substrate to at least one halogen, a coefficient of thermal expansion of the environmental barrier layer is less than a coefficient of thermal expansion of the stress buffer layer.

10. The method of claim 9, wherein the metal substrate comprises stainless steel and the bonding layer comprises chromium oxide.

11. The method of claim 9, wherein the stress buffer layer comprises aluminum oxide, and wherein the stress buffer layer is characterized by a CTE that is greater than the coefficient of thermal expansion of the environmental barrier layer and less than a coefficient of thermal expansion of the metal substrate.

12. The method of claim 9, wherein the environmental barrier layer comprises silicon dioxide and-the multilayer coating increases the corrosion resistance of the metal substrate to chlorine.

13. The method of claim 9, wherein the environmental barrier layer comprises hafnium oxide and the multilayer coating increases the corrosion resistance of the metal substrate to halogen-containing compounds.

14. The method of claim 9, wherein the metal substrate is incorporated into a component of a semiconductor fabrication apparatus that is exposed to the at least one halogen.

* * * * *